(12) United States Patent
Ishii et al.

(10) Patent No.: US 6,717,258 B2
(45) Date of Patent: Apr. 6, 2004

(54) POWER SEMICONDUCTOR DEVICE (75) Inventors: Kazufumi Ishii, Tokyo (JP); Shinichi Iura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/276,291

(22) PCT Filed: Apr. 2, 2001

(86) PCT No.: PCT/JP01/02876

§ 371 (c)(1),
(2), (4) Date: Nov. 21, 2002

(87) PCT Pub. No.: WO02/082542

PCT Pub. Date: Oct. 17, 2002

(65) Prior Publication Data

US 2003/0168726 A1 Sep. 11, 2003

(51) Int. Cl.[7] .......................... H01L 23/52; H01L 23/12
(52) U.S. Cl. .................... 257/691; 678/793; 678/704
(58) Field of Search ............................. 257/691, 678, 257/793, 704

(56) References Cited

U.S. PATENT DOCUMENTS

| | | | | |
|---|---|---|---|---|
| 5,497,289 A | * | 3/1996 | Sugishima et al. | 361/709 |
| 5,519,252 A | * | 5/1996 | Soyano et al. | 257/690 |
| 5,920,119 A | * | 7/1999 | Tamba et al. | 257/718 |
| 5,966,291 A | | 10/1999 | Beumel et al. | |
| 6,144,571 A | * | 11/2000 | Sasaki et al. | 257/676 |
| 6,353,258 B1 | * | 3/2002 | Inoue et al. | 257/723 |
| 6,421,244 B1 | * | 7/2002 | Shinohara et al. | 361/736 |
| 6,597,063 B1 | * | 7/2003 | Shimizu et al. | 257/687 |
| 2001/0038143 A1 | * | 11/2001 | Sonobe et al. | 257/690 |
| 2003/0086246 | | * 5/2003 | Wakabayashi et al. | 361/728 |

FOREIGN PATENT DOCUMENTS

| | | | | |
|---|---|---|---|---|
| EP | 772235 | 5/1997 | | |
| JP | 9-130068 | 5/1997 | | |
| JP | 9-312376 | 12/1997 | | |
| JP | 9-321217 | * 12/1997 | ........... | H01L/25/07 |
| JP | 11-4584 | 1/1999 | | |
| JP | 2000-323646 | * 11/2000 | ........... | H01L/25/07 |

* cited by examiner

*Primary Examiner*—Jasmine Clark
(74) *Attorney, Agent, or Firm*—Oblon, Spivak, McClelland, Maier & Neustadt, P.C.

(57) ABSTRACT

In order to provide semiconductor device modules which are capable of solving problems caused by the presence of the control board, and facilitating electric connection between power semiconductor elements and main circuit terminals and lightening restrictions on the number and layout of the power semiconductor elements, a control emitter relay terminal, a gate relay terminal, and a relay terminal are connected to a control board disposed above an edge portion of the semiconductor device module. The control board has control circuitry and elements for controlling operations of an IGBT device and a diode device, and also has a control emitter interconnection pattern to which the control emitter relay terminal is connected and a gate interconnection pattern to which the gate relay terminal is connected, where these interconnection patterns are connected to control circuitry.

7 Claims, 8 Drawing Sheets

Background Art

POWER SEMICONDUCTOR DEVICE

TECHNICAL FILED

The present invention relates to power semiconductor devices and particularly to a power semiconductor device which has a plurality of semiconductor device modules.

BACKGROUND ART

Figure 11:
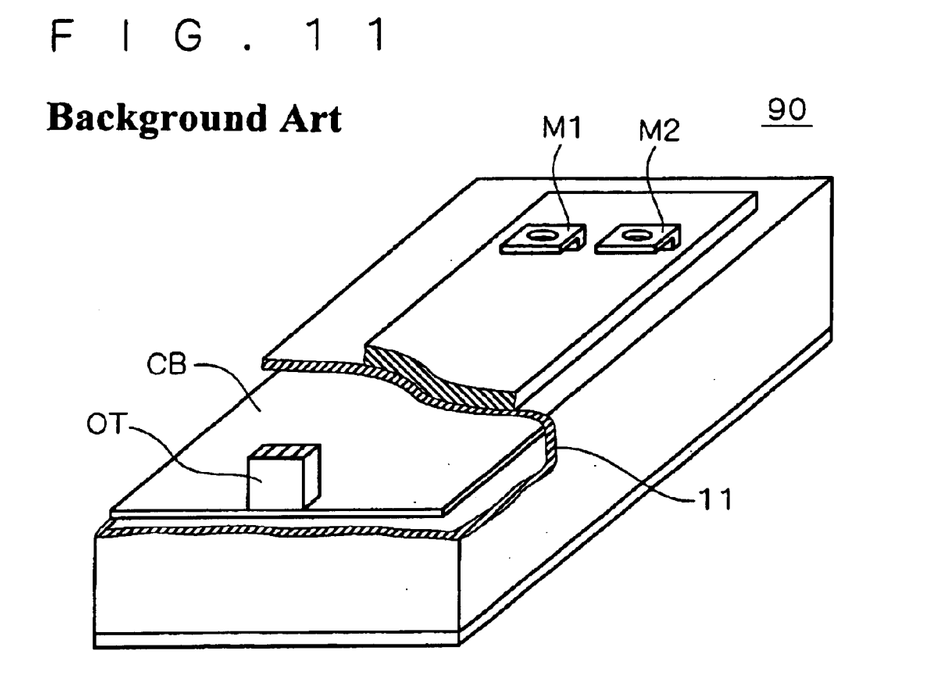
FIG. 11 is a perspective view showing the structure of a conventional semiconductor device module.

FIG. 11 is a perspective view that shows a semiconductor device module 90 as an example of a conventional power semiconductor device. FIG. 11 is partially broken to show the internal structure.

As shown in FIG. 11, the semiconductor device module 90 has power semiconductor elements, not shown, that are accommodated in a box-like resin case 11, and a control board CB disposed above the power semiconductor elements.

The control board CB has control circuitry and elements for controlling the operation of the power semiconductor elements, such as an IGBT (Insulated Gate Bipolar Transistor) device and a diode device, and the control board CB is contained inside to allow the semiconductor device module 90 to work as an IPM (Intelligent Power Module).

The control board CB is disposed to almost entirely cover the area where the power semiconductor elements are located and is electrically connected to the power semiconductor elements through connecting means not shown. On its upper main surface, a derive terminal OT is provided to externally output the operating conditions of the power semiconductor elements inside and to supply power to the control circuitry; the derive terminal OT protrudes from the top surface of the resin case 11 so that it can be electrically connected to the outside. The resin case 11 is sealed with resin material, though the drawing does not show the resin.

Main circuit terminals M1 and M2 for input/output of the main current flowing in the internal power semiconductor elements are provided in a peripheral portion not covered with the control board CB and protrude from the peripheral portion of the top surface of the resin case 11 so that it can be electrically connected to the outside.

While the semiconductor device module 90 is structured as shown above, there are other semiconductor device modules in which the control board CB is located on the same plane as the power semiconductor elements.

While the conventional semiconductor device module 90 contains the control board BC inside as shown above, this structure may restrict the position of the main circuit terminals M1 and M2, or the lead paths of the main circuit terminals M1 and M2 to be longer, which increases the inductance and may affect the performance of the semiconductor device module by, e.g. increasing the surge voltage.

Also, in a semiconductor device module in which the control board is placed on the same plane as the power semiconductor elements, the area for installation of the power semiconductor elements is limited, which limits the number and layout of the power semiconductor elements installed.

DISCLOSURE OF THE INVENTION

The present invention has been made to solve the problems shown above, and an object of the invention is to provide a semiconductor device module which is capable of solving problems caused by the presence of the control board, and facilitating the electric connection between the power semiconductor elements and main circuit terminals and lightening restrictions on the number and layout of the power semiconductor elements.

According to a first aspect of the invention, a semiconductor device module includes: a plurality of semiconductor device modules each comprising a resin case, a power semiconductor element accommodated in said resin case, a main circuit terminal protruding outward from said resin case and in which a main current of said power semiconductor element flows, and a control terminal protruding outward from said resin case and to which a control signal for controlling said power semiconductor element is inputted; a bus bar electrically connecting in common said main circuit terminals of said plurality of semiconductor device modules, said main circuit terminals being arranged in line; and a control board disposed to at least cover a disposed area of said protruding control terminals of said plurality of semiconductor device modules and electrically connected to said control terminals.

In accordance with the first aspect of the semiconductor device module of the invention, the lead path of the of the power semiconductor element can be selected freely because the control board is disposed outside the semiconductor device module. This facilitates making electric connection between the power semiconductor element and the main circuit terminal. Providing the control board outside also lightens restrictions on the number and layout of the power semiconductor elements installed. Furthermore, the plurality of semiconductor device modules are arranged so that their respective main circuit terminals are aligned and the main circuit terminals are electrically connected in common by the bus bar, so that the bus bar functions also as means for mechanically connecting the plurality of semiconductor device modules, which offers a structurally stronger power semiconductor device without the need for specialized connecting means.

According to a second aspect of the semiconductor device module of the invention, said control terminal protrudes outward from an edge portion of said resin case, and said control board is disposed to cover only an area over said edge portions of said plurality of semiconductor device modules from which said control terminals protrude.

According to the second aspect of the semiconductor device module of the invention, the control board is disposed to cover only the area over the edge portions of the plurality of semiconductor device modules from which the control terminals protrude, which allows the control board to be sized smaller.

According to a third aspect of the semiconductor device module of the invention, said plurality of semiconductor device modules are arranged in rows so that their respective said edge portions from which said control terminals protrude lie next to each other, and said control board is disposed to extend over said edge portions across from one said row to another of said plurality of semiconductor device modules.

According to the third aspect of the semiconductor device module of the invention, the plurality of semiconductor device modules are arranged so that the edge portions from which their respective control terminals protrude lie next to each other; the control terminals thus stand close to each other and the control board can be small in size.

According to a fourth aspect of the semiconductor device module of the invention, said control board is disposed above said bus bar and is sized to cover almost all the region where said plurality of semiconductor device modules are disposed.

According to the fourth aspect of the semiconductor device module of the invention, the control board is sized to cover almost all area where the plurality of semiconductor device modules are disposed and the control board is placed above the bus bar, which eliminates the need to form opening etc. in the control board so that the main circuit terminals can pass through there, thus offering a strong and firm control board. This structure also increases the freedom of the layout of the plurality of semiconductor device modules.

According to a fifth aspect of the semiconductor device module of the invention, said control board is disposed to cover said plurality of semiconductor device modules except in an area where said main circuit terminals are disposed.

According to the fifth aspect of the semiconductor device module of the invention, the structure increases the freedom of the layout of the plurality of semiconductor device modules.

According to a sixth aspect of the semiconductor device module of the invention, said control board has an interconnection pattern electrically connecting said control terminals in common, and said interconnection pattern has a non-loop shape in a plan view.

According to the sixth aspect of the semiconductor device module of the invention, the interconnection pattern has a non-loop shape in the plan view, which prevents the problem that the main circuit current flowing through the main circuit terminals exerts influence to cause a circular flow of induced current which would vary characteristics of the power semiconductor elements.

According to a seventh aspect of the invention, a semiconductor device module comprises: a plurality of semiconductor device modules each comprising a resin case, a power semiconductor element accommodated in said resin case, and a control terminal protruding outward from an edge portion of said resin case and to which a control signal for controlling said power semiconductor element is inputted; and a control board electrically connected to said control terminals; wherein said plurality of semiconductor device modules are arranged in rows so that their respective said edge portions from which said control terminals protrude lie next to each other, and said control board is disposed to extend over said edge portions across from one said row to another of said plurality of semiconductor device modules.

According to the seventh aspect of the semiconductor module of the invention, the plurality of semiconductor device modules are arranged so that their edge portions from which the respective control terminals protrude lie next to each other; thus the control terminals stand close to each other and the control board can be small in size.

The objects, features, aspects and advantages of the present invention will become more apparent from the following detailed description and the accompanying drawings.

BEST MODE FOR CARRYING OUT THE INVENTION

Preferred Embodiment

Device Structure.

Figure 1:
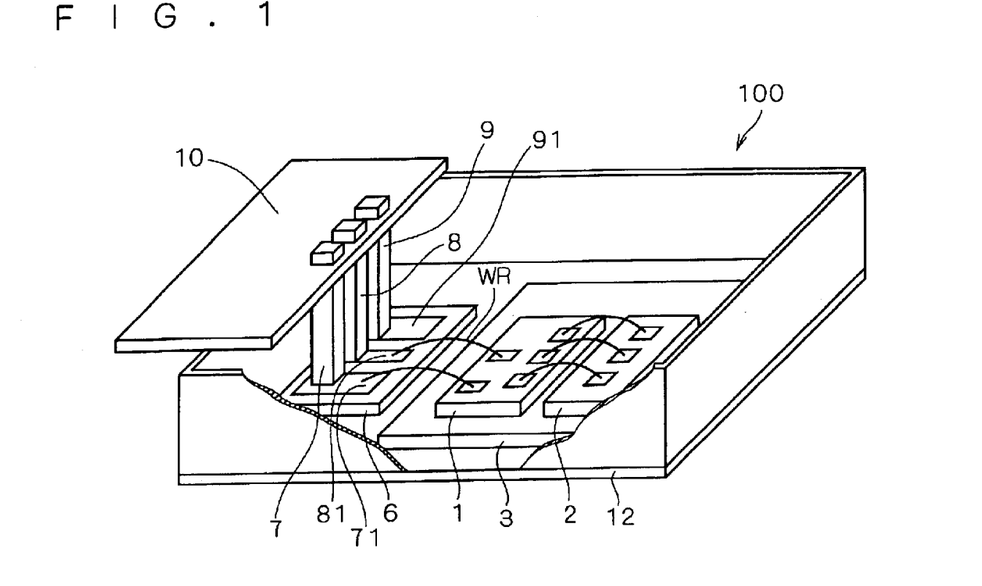
FIG. 1 is a perspective view showing the structure of a preferred embodiment of the power semiconductor device of the invention.

FIG. 1 is a perspective view that shows a semiconductor device module 100 as a preferred embodiment of the power semiconductor device of the present invention. FIG. 1 is partially broken to show the internal structure.

In FIG. 1, a bottom substrate 12 has a rectangular shape in the plan view and is made of a material having good thermal conductivity, e.g. metal, and an insulating substrate 3 is provided on the bottom substrate 12, and a set of one IGBT device 1 and one diode device 2 are provided on the insulating substrate 3. A box-like resin case 11 surrounds the bottom substrate 12, and a resin material is sealed in the space defined by the bottom substrate 12 and the resin case 11. The drawing does not show the resin.

Figure 2:
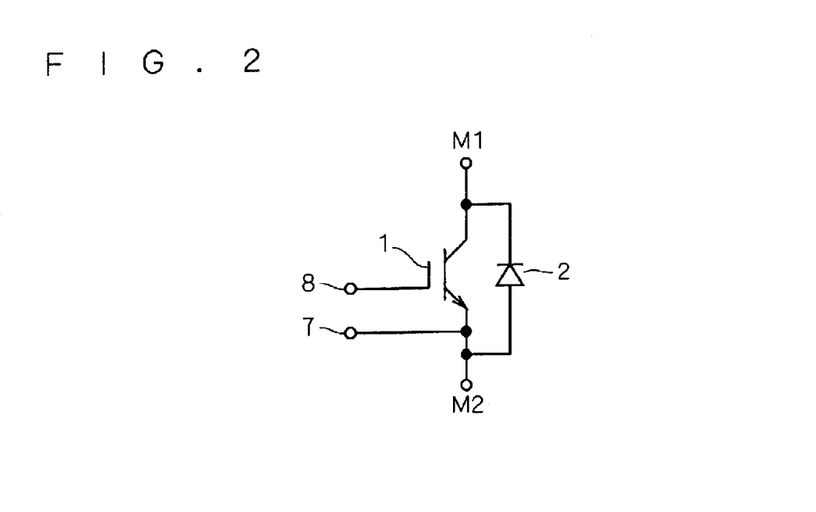
FIG. 2 is a diagram showing the connection of the power semiconductor elements.

FIG. 2 shows the connection of the IGBT device 1 and the diode device 2. The diode device 2 is connected in parallel with the IGBT device 1 in such a direction that the forward current flows back to the IGBT device 1. The IGBT device 1 has a main collector electrode and a main emitter electrode that are externally connected through main circuit terminals M1 and M2 and a control emitter electrode and a gate electrode that are externally connected respectively through a control emitter relay terminal 7 and a gate relay terminal 8. The control emitter relay terminal 7 and the gate relay terminal 8 can be referred to as control terminals since control signals are inputted to them.

In FIG. 1, in the peripheral portion of the bottom substrate 12, a relay terminal plate 6 is disposed along the insulating substrate 3, with the IGBT device 1 located closer to the edge on the side of the relay terminal plate 6 on the bottom substrate 12.

The relay terminal plate 6 has electrically insulated control emitter pad 71 and gate pad 81 formed on a main surface of an insulating substrate, for example. The control emitter pad 71 is electrically connected to the control emitter electrode (or the emitter electrode) of the IGBT device 1 through wire interconnection WR (aluminum wire) and the gate pad 81 is electrically connected to the gate electrode of the IGBT device 1 through wire interconnection WR. The emitter electrode of the IGBT device 1 is electrically connected to the anode of the diode device 2 through wire interconnection WR.

The control emitter relay terminal 7 and the gate relay terminal 8, which vertically extend, are connected respectively to the control emitter pad 71 and the gate pad 81; the control emitter relay terminal 7 and the gate relay terminal 8 protrude outward from the edge portion of the upper surface of the resin case 11.

The control emitter relay terminal 7 and the control emitter pad 71, and the gate relay terminal 8 and the gate pad 81, are connected by soldering, for example.

The structure of FIG. 1 also has a relay terminal 9 that protrudes along with the control emitter relay terminal 7 and the gate relay terminal 8. While the relay terminal 9 is connected to a pad 91 that is provided on the relay terminal plate 6 alongside the control emitter pad 71 and the gate pad 81, the pad 91 is connected to nowhere. The pad 91 and the relay terminal 9 are used when necessary, which are connected, e.g. to a current sense electrode of the IGBT device 1. The current sense electrode is an electrode to which a current (sense current) flows which corresponds to a very tiny fraction (much less than one thousandth) of the current flowing to the main emitter electrode; by detecting the sense current, the IGBT device 1 can be protected from surge current and short circuit.

While the user will decide whether to detect the sense current, previously providing the pad 91 and the relay terminal 9 offers the user convenience. The module may be provided with only the pad 91, in which case the relay terminal 9 will be connected thereto when required.

The control emitter relay terminal 7, the gate relay terminal 8, and the relay terminal 9 are connected by, e.g. soldering, to the control board 10 disposed above the edge of the semiconductor device module 100.

The control board 10 has control circuitry (not shown) and elements for controlling operation of the IGBT device 1 and the diode device 2, and also has a control emitter interconnection pattern to which the control emitter relay terminal 7 is connected and a gate interconnection pattern to which the gate relay terminal 8 is connected, where these interconnection patterns are connected to the control circuitry.

Although FIG. 1 does not show main circuit terminals for externally connecting the main collector electrode and the main emitter electrode of the IGBT device 1, the lead paths of the main circuit terminals can be relatively freely selected since the control board 10 is disposed outside the semiconductor device module 100 to partially cover its edge portion.

Figure 3:
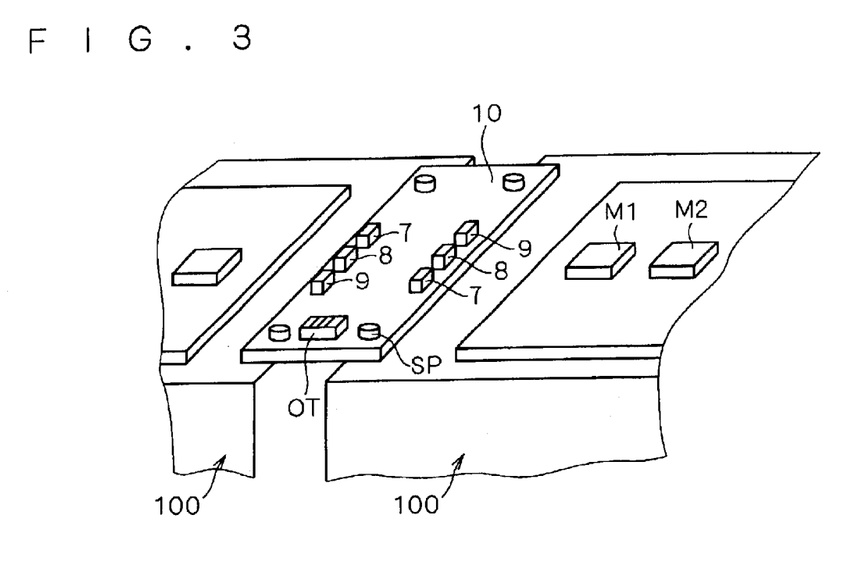
FIG. 3 is a perspective view showing the structure of the preferred embodiment of the power semiconductor device of the invention.

Next, a further function of the control board 10 is described referring to FIG. 3. While the control board 10 of FIG. 1 is engaged with the control emitter relay terminal 7, the gate relay terminal 8, and the relay terminal 9 which protrude from one of the four edges of the top surface of the semiconductor device module 100, it may be disposed over the edges of two semiconductor device modules 100 as shown in FIG. 3 and engaged with the control emitter relay terminals 7, gate relay terminals 8 and relay terminals 9 which protrude at the respective edges of the two semiconductor device modules 100 (hereinafter these relay terminals may be referred to as groups of relay terminals).

In this structure, the control emitter relay terminals 7 of the two semiconductor device modules 100, and their gate relay terminals 8, i.e. relay terminals of the same kind, are electrically connected in common in the control board 10, so that the two semiconductor device modules 100 can be controlled in parallel. Such a structure in which a plurality of semiconductor device modules are controlled in parallel is called a module unit.

In FIG. 3, the control board 10 is supported by supports SP provided at the four corners and a derive terminal OT is provided on its upper main surface to externally output operating conditions of the power semiconductor elements inside and to supply power to the control circuitry (not shown).

Figure 4:
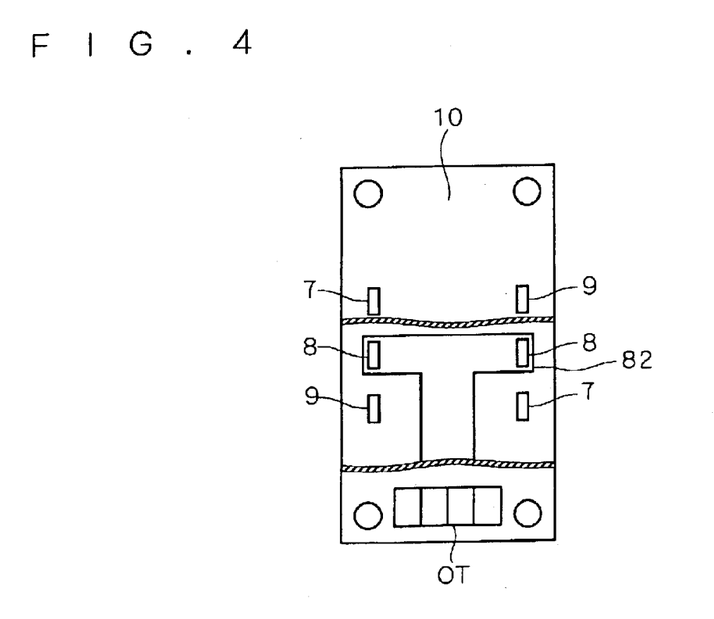
FIG. 4 is a plan view showing the structure of a control board of the power semiconductor device of the invention.
Figure 5:
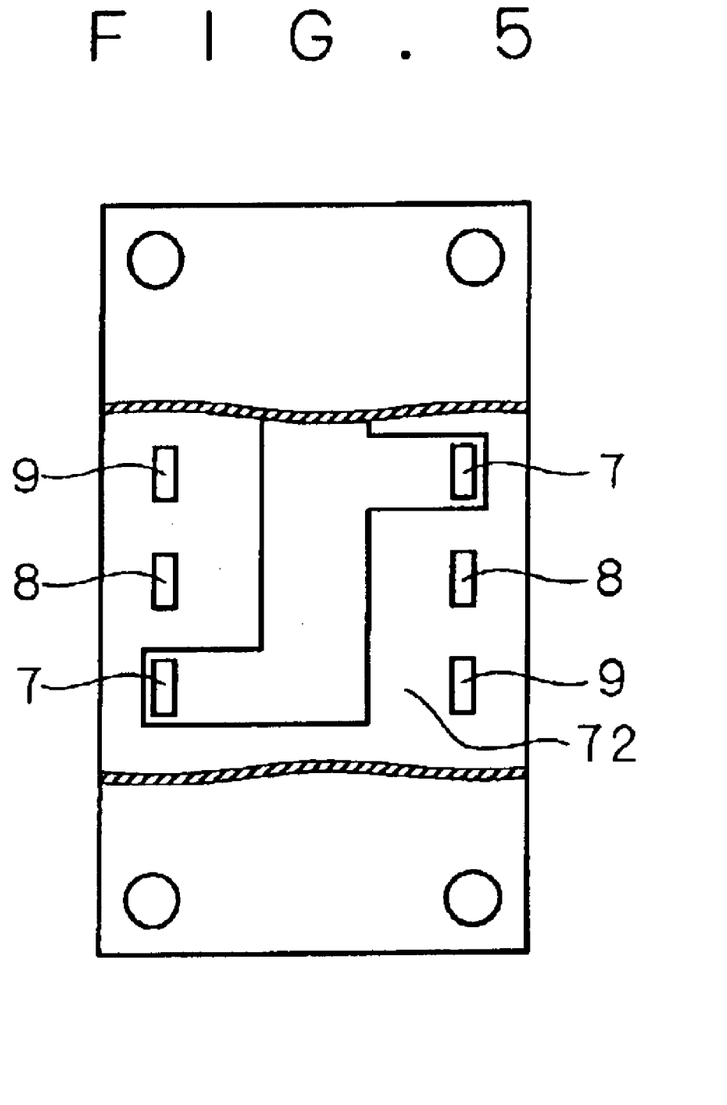
FIG. 5 is a plan view showing the structure of the control board of the power semiconductor device of the invention.

FIG. 4 is a plan view, seen from above, of the control board 10 engaging with the two semiconductor device modules 100, and FIG. 5 is its plan view seen from below. FIGS. 4 and 5 are partially broken to show the internal structure of the control board 10.

As shown in FIG. 4, the control board 10 has a gate interconnection pattern 82 formed on its upper main surface side to connect the respective gate relay terminals 8, and it also has, as shown in FIG. 5, an emitter interconnection pattern 72 formed on its lower main surface side to connect the respective control emitter relay terminals 7, and the two main surfaces are covered by an insulator. When it is necessary to connect the respective relay terminals 9, a multi-layer board is used and an interconnection pattern for mutually connecting the relay terminals 9 is formed in a layer between the gate interconnection pattern 82 and the emitter interconnection pattern 72.

Needless to say, the emitter interconnection pattern 72 is formed in such a manner that the gate relay terminals 8 and the emitter interconnection pattern 72 will not come in contact with each other, and the interconnection patterns and the relay terminals are electrically connected firmly by soldering etc.

As for another structure, other than that shown in FIG. 3, for connecting two semiconductor device modules 100 in parallel, two semiconductor device modules 100 may be arranged so that their respective relay terminal groups are aligned in a line and connected with a control board that connects the relay terminals of the same kinds in common. A structure expanded on the basis of this structure will be described later referring to FIG. 6.

Now, referring back to FIG. 3, the semiconductor device module 100 on the left side in FIG. 3 has a group of relay terminals disposed at the right edge and the semiconductor device module 100 on the right side has a group of relay terminals disposed at the left edge.

The area of the control board can thus be reduced by arranging the two parallel-controlled semiconductor device modules 100 so that their respective relay terminal groups are placed close; for this purpose, the two semiconductor device modules 100 are arranged in opposite directions and in parallel to each other so that their respective edges from which the relay terminal groups protrude lie next to each other.

That is to say, in FIG. 3, the semiconductor device module 100 on the left side in the drawing has its control emitter relay terminal 7 located at the farther end and the semiconductor device module 100 on the right side in the drawing has its relay terminal 9 located at the farther end; the two semiconductor device modules 100 are thus arranged in opposite directions.

Figure 6:
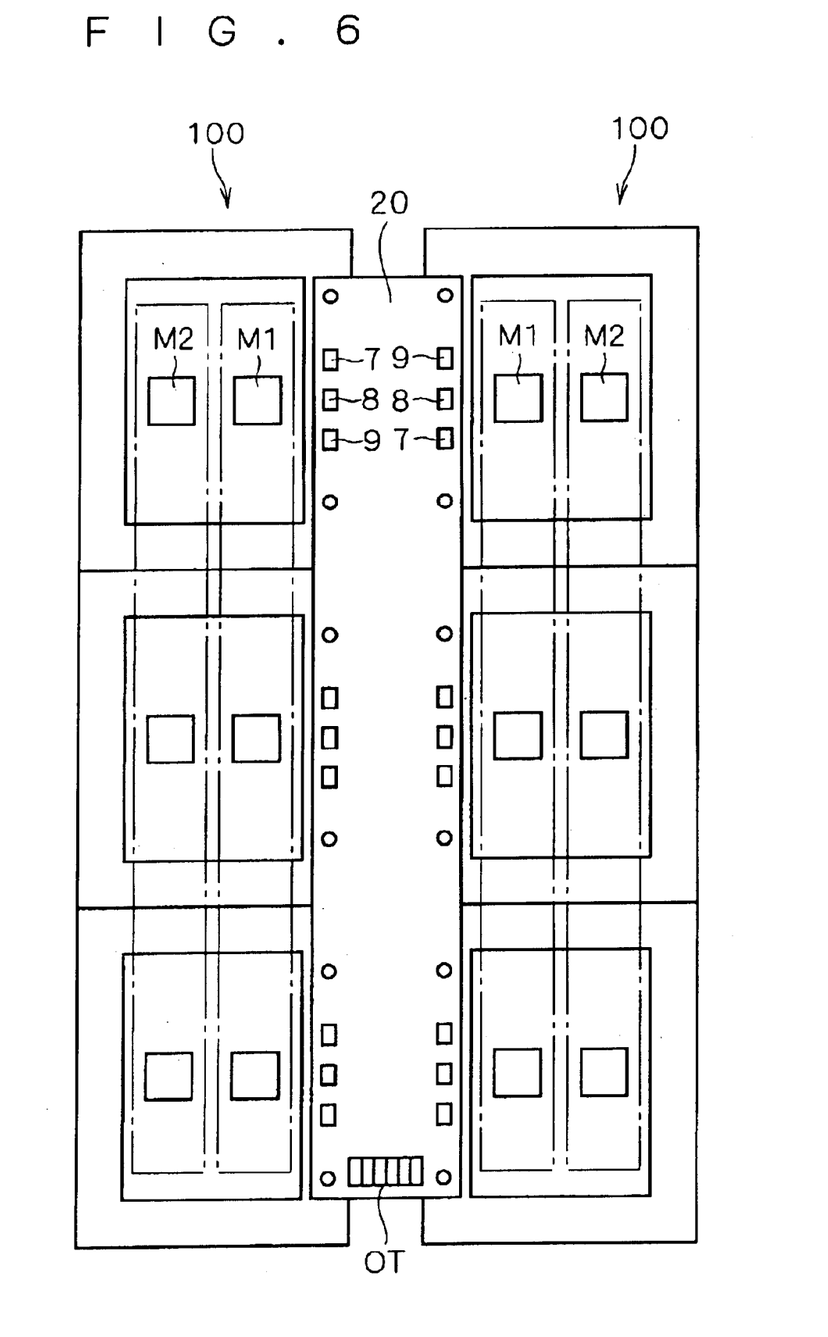
FIG. 6 is a plan view showing an example of arrangement of semiconductor device modules.

While FIG. 3 shows two semiconductor device modules 100 that are controlled in parallel with their respective relay terminal groups electrically connected in common by the control board 10, more than two semiconductor device modules 100 can be controlled in parallel; for example, as shown in FIG. 6, a total of six semiconductor device modules 100 may be connected to form a module unit by using a control board 20 that can connect three semiconductor device modules 100 on each side.

While the lead paths of the main circuit terminals M1 and M2 can be freely selected as mentioned before, controlling a plurality of semiconductor device modules in parallel requires electrically connecting in common the main circuit terminals of the same kinds, M1 and M2. As for means for making the connection, in the arrangement of semiconductor device modules shown in FIG. 6, for example, it is efficient to dispose strip-like bus bars made of conductor plate as shown by one-dot chain line, so as to mutually connect main circuit terminals of the same kind in a straight line; therefore it is desired that main circuit terminals of the same kind be arranged in line without any main circuit terminals of a different kind interposed between them. In FIG. 6, the plurality of main circuit terminals M1 and M2 are aligned in respective lines in parallel.

Figure 10:
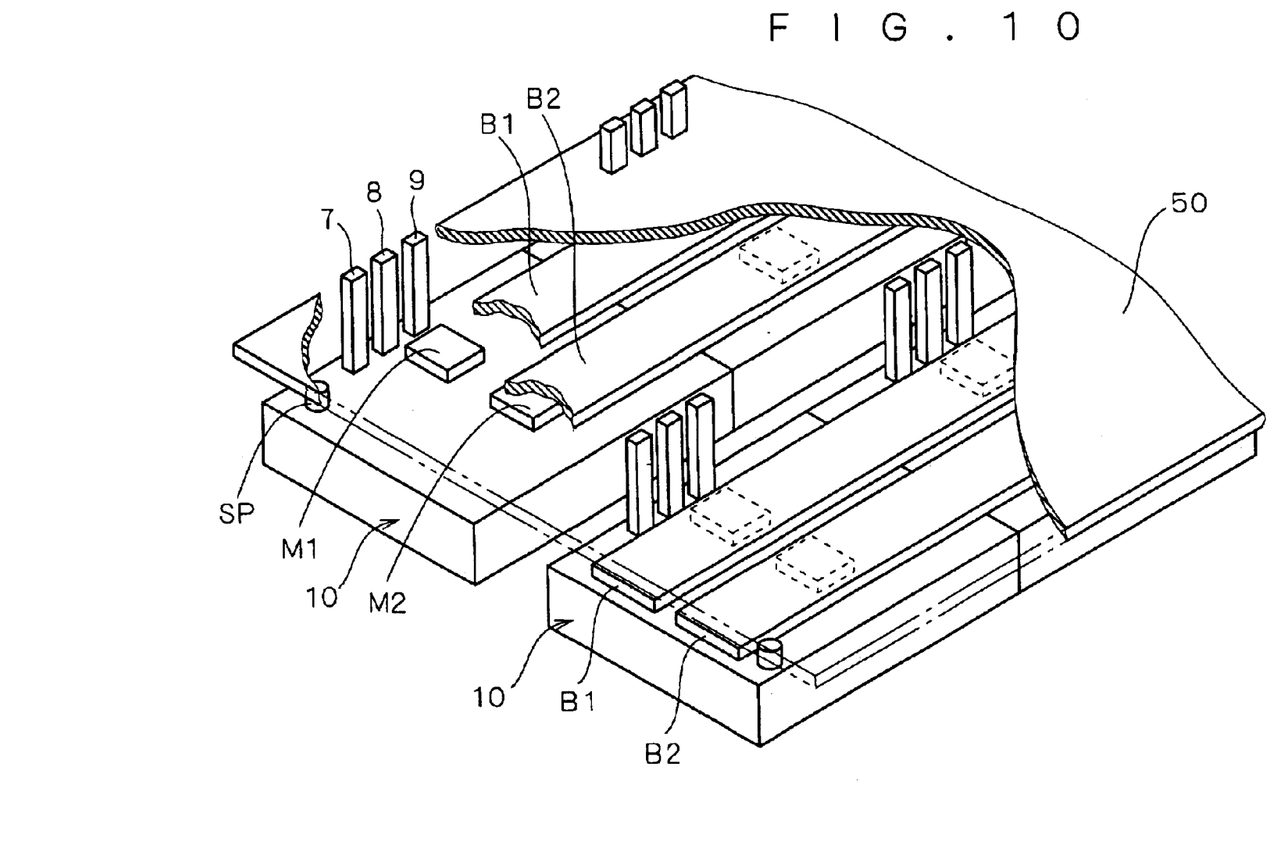
FIG. 10 is a perspective view showing the structure of a variation of the preferred embodiment of the power semiconductor device of the invention.

Needless to say, this is desirable also for a semiconductor device module having a plurality of main circuit terminals M1 and M2. A specific structure of the bus bars is shown in FIG. 10.

The bus bar not only electrically connects main circuit terminals of the same kind in common but also functions as means for mechanically connecting the plurality of semiconductor device modules, thus providing a rigidly-structured module unit without a need for specialized connecting means.

While FIG. 6 shows semiconductor device modules 100 arranged in two lines, they may be arranged only in one line. Anyway, a plurality of semiconductor device modules can be controlled in parallel by using a control board that can connect the same kind of relay terminals in common.

Figure 7:
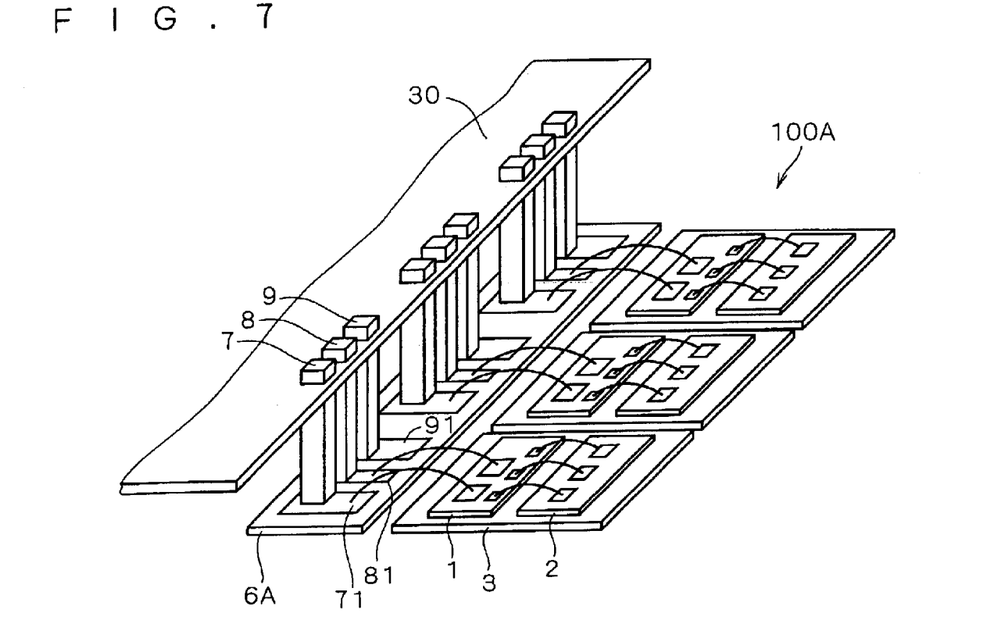
FIG. 7 is a perspective view showing the structure of a semiconductor device module.

While the semiconductor device module 100 shown in FIG. 1 has one IGBT device 1 and one diode device 2 and one group of relay terminals for them, the structure of the semiconductor device module is not limited to this structure; for example, as shown in FIG. 7, a semiconductor device module 100A may be provided with a plurality of sets each including an IGBT device 1 and a diode device 2, and one group of relay terminals for each set.

In this case, the control board 30 is formed to be connected to the three groups of relay terminals and the relay terminal plate 6A is formed so that three control emitter pads 71, three gate pads 81 and three pads 91 can be provided thereon.

This structure is provided with a plurality of sets of IGBT devices 1 and diode devices 2, the same number of relay terminal groups, and the same number of sets of the main circuit terminals M1 and M2.

Figure 8:
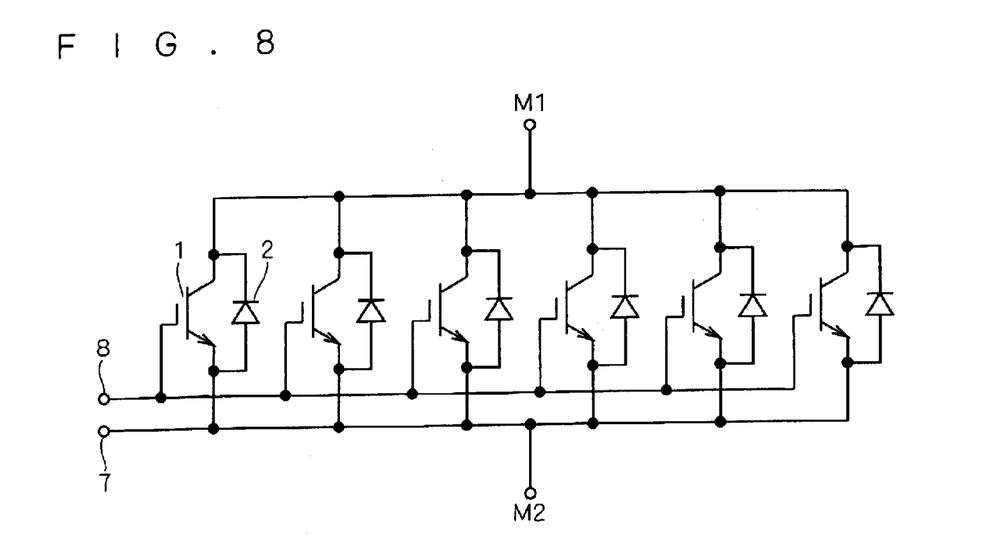
FIG. 8 is a diagram showing the connection of power semiconductor elements.

While the semiconductor device module 100A shown in FIG. 7 has a plurality of sets of IGBT devices 1 and diode devices 2, with one group of relay terminals for each set, six IGBT devices 1 may be connected in parallel as shown in FIG. 8, with one diode device 2 connected in parallel to each.

In this case, the gate electrodes of the individual IGBT devices 1 are connected to the gate relay terminal 8 in common and their control emitter electrodes are connected to the control emitter relay terminal 7 in common. The main collector electrodes and the main emitter electrodes of the individual IGBT devices 1 are connected to the main circuit terminals M1 and M2 in common.

In this structure, one group of relay terminals and one set of main circuit terminals M1 and M2 are provided for the six sets of IGBT devices 1 and diode devices 2.

Functions and Effects

As described above, in the semiconductor device module 100, the control board 10 is disposed outside the semiconductor device module 100 and partially covers the area above the edge of the semiconductor device module 100, so that the lead paths of the main circuit terminals can be freely selected to externally connect the main collector electrode and the main emitter electrode of the IGBT device 1. The power semiconductor element and the main circuit terminals can thus be electrically connected with ease.

Furthermore, disposing the control board 10 outside lightens restrictions on the number and layout of the installed power semiconductor elements.

Moreover, since the control emitter relay terminal 7 and the gate relay terminal 8 protrude outward from the edge portion of the upper surface of the resin case 11, a plurality of semiconductor device modules 100 can be controlled in parallel, with the plurality of semiconductor device modules 100 arranged in two rows in parallel in such a way that their respective relay terminal groups face each other, and with the control board 10 engaging with the relay terminal groups of the plurality of semiconductor device modules 100 to mutually connect the relay terminals of the same kinds in common in the control board 100.

Variation 1.

In the preferred embodiment shown above, the control board 10 is engaged with the semiconductor device module 100 that has a group of relay terminals (i.e. the control emitter relay terminal 7, the gate relay terminal 8 and the relay terminal 9) that protrude from one of the four edge portions; however, the control board will be formed in a different manner when used with semiconductor device modules having a plurality of relay terminal groups.

Figure 9:
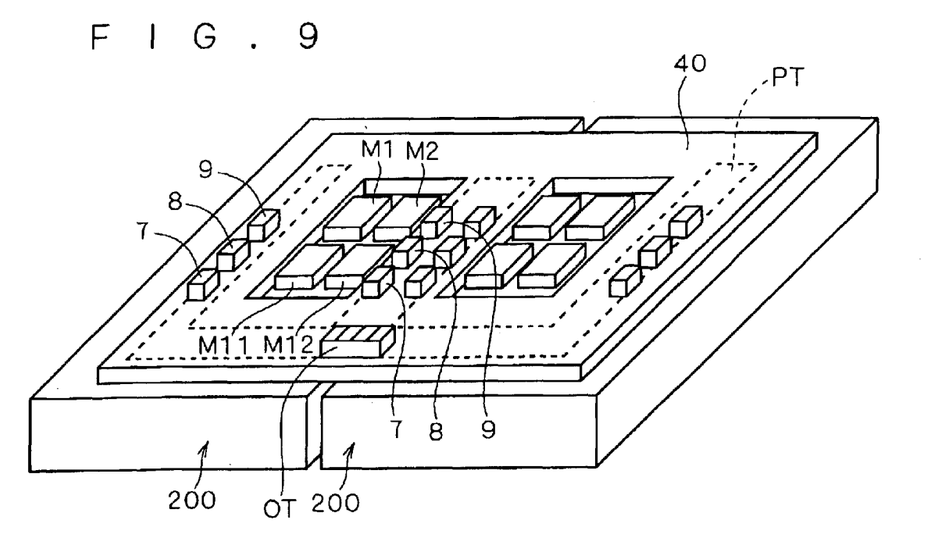
FIG. 9 is a perspective view showing the structure of a variation of the preferred embodiment of the power semiconductor device of the invention.

FIG. 9 shows semiconductor device modules 200 each having relay terminal groups protruding from opposite two of its four edge portions. The two semiconductor device modules 200 on the right and left sides in FIG. 9 have the same structure.

In FIG. 9, each semiconductor device module 200 has relay terminal groups on the two, right and left, edge portions and two sets of main circuit terminals M1 and M2, and M11 and M12.

The main circuit terminals M1 and M2 form a set with the relay terminal group on the left side in the drawing and the main circuit terminals M11 and M12 form a set with the relay terminal group on the right side.

A control board 40 is provided to cover the two semiconductor device modules 200 except in the areas where the main circuit terminals M1 and M2 and the main circuit terminals M11 and M12 are located.

The control board 40 has an interconnection pattern PT which engages with the four relay terminal groups to connect the relay terminals of the same kind in common, so that the two semiconductor device modules 200 can be controlled in parallel. The use of this control board 40 increases the freedom of layout of the semiconductor device modules.

While the shape of the interconnection pattern PT shown with broken line in FIG. 9 is just an example, thus forming the interconnection pattern not in a loop shape similar to the shape of the control board 40 in plan view but in a non-loop shape leaving some area where the pattern is absent prevents the problem that the main circuit current flowing through the main circuit terminals M1 and M2 and the main circuit terminals M11 and M12 exerts influence to cause a circular flow of induced current to vary the gate characteristic.

In the interconnection pattern PT, as described referring to FIG. 4, the emitter interconnection pattern 72 is formed on the lower main surface side and the gate interconnection pattern 82 is formed on the upper main surface side, so that short circuit between the interconnection patterns can be prevented.

In the structure shown above, the control board 40 connects two semiconductor device modules 200; however, needless to say, the control board 40 can be formed larger in size to connect a larger number of semiconductor device modules 200.

Variation 2.

While the control board 10 described in the preferred embodiment is suited for parallel control of a module unit in which the semiconductor device modules 100 are arranged in two rows in parallel so that the relay terminal groups stand adjacent to each other, restrictions on the layout of the semiconductor device modules can be lightened by adopting the control board 50 shown in FIG. 10.

In FIG. 10, a plurality of semiconductor device modules 100 are arranged in two rows and the control board 50 is disposed above them and engaged with the individual relay terminal groups (i.e. the control emitter relay terminal 7, the gate relay terminal 8, and the relay terminal 9).

While the semiconductor device modules 100 are arranged so that the main circuit terminals of the same kind are aligned, the relay terminal groups do not face each other between the rows.

This is possible because the control board 50 has an area which almost entirely covers the arrangement of the semiconductor device modules 100 and it can be engaged with the relay terminal groups anywhere in this area.

The restrictions on the arrangement of the semiconductor device modules 100 can thus be lightened; however, it is desired that the main circuit terminals of the same kind be arranged in line since controlling a plurality of semiconductor device modules 100 in parallel requires connecting the main circuit terminals of the same kind in common.

That is to say, as shown in FIG. 10, in the individual rows of the semiconductor device modules 100, bus bars B1 and B2 are provided to electrically connect in common the main circuit terminals M1 and M2 aligned in lines.

For the provision of the bus bars B1 and B2, the control board 50 is positioned in a higher position than the bus bars B1 and B2; the control board 50 can be supported in a stable manner on supports SP provided on the semiconductor device modules 100.

Also, all the semiconductor device modules 100 can be controlled in parallel by connecting the bus bars B1 in common, and the bus bars B2 in common.

The control board 50 has no opening and is hence structurally stronger and the bus bars B1 and B2 thus connect the main circuit terminals M1 and M2, which provides a structurally stronger module unit.

While the invention has been described in detail, the foregoing description is in all aspects illustrative and not restrictive. It is understood that numerous other modifications and variations can be devised without departing from the scope of the invention.

What is claimed is:

1. A power semiconductor device, comprising:
   a plurality of semiconductor device modules each comprising,
      a resin case,
      a power semiconductor element accommodated in said resin case,
      a main circuit terminal protruding outward from said resin case and in which a main current of said power semiconductor element flows, and
      a control terminal protruding outward from said resin case and to which a control signal for controlling said power semiconductor element is inputted;
   a bus bar electrically connecting in common said main circuit terminals of said plurality of semiconductor device modules, said main circuit terminals being arranged in line; and
   a control board disposed to at least cover a disposed area of said protruding control terminals of said plurality of semiconductor device modules and electrically connected to said control terminals.

2. The power semiconductor device according to claim 1, wherein said control terminal protrudes outward from an edge portion of said resin case, and
   said control board is disposed to cover only an area over said edge portions of said plurality of semiconductor device modules from which said control terminals protrude.

3. The power semiconductor device according to claim 2, wherein said plurality of semiconductor device modules are arranged in rows so that their respective said edge portions from which said control terminals protrude lie next to each other, and
   said control board is disposed to extend over said edge portions across from one said row to another of said plurality of semiconductor device modules.

4. The power semiconductor device according to claim 1, wherein said control board is disposed above said bus bar and is sized to cover almost all of the region where said plurality of semiconductor device modules are disposed.

5. The power semiconductor device according to claim 1, wherein said control board is disposed to cover said plurality of semiconductor device modules except in an area where said main circuit terminals are disposed.

6. The power semiconductor device according to claim 5, wherein said control board has an interconnection pattern electrically connecting said control terminals in common, and
   said interconnection pattern has a non-loop shape in a plan view.

7. A power semiconductor device, comprising:
   a plurality of semiconductor device modules each comprising,
      a resin case,
      a power semiconductor element accommodated in said resin case, and
      a control terminal protruding outward from an edge portion of said resin case and to which a control signal for controlling said power semiconductor element is inputted; and
   a control board electrically connected to said control terminals;
   said plurality of semiconductor device modules being arranged in rows so that their respective said edge portions from which said control terminals protrude lie next to each other,
   said control board being disposed to extend over said edge portions across from one said row to another of said plurality of semiconductor device modules.

* * * * *